(12) United States Patent
Safrani et al.

(10) Patent No.: US 10,126,582 B2
(45) Date of Patent: Nov. 13, 2018

(54) SWIR TO VISIBLE UP-CONVERSION OPTICAL SYSTEM

(71) Applicant: B.G. NEGEV TECHNOLOGIES AND APPLICATIONS LTD., AT BEN-GURION UNIVERSITY, Beer Sheva (IL)

(72) Inventors: Avner Safrani, D.N Misgav (IL); Ibrahim Abdulhalim, Wahat-Alsalam-Neve Shalom (IL); Viki Magen, Holon (IL); Gabby Sarusi, Rishon Lezion (IL)

(73) Assignee: B. G. Negev Technologies and Applications, Ltd., at Ben-Gurion University, Beer Sheva (IL)

( * ) Notice: Subject to any disclaimer, the term of this patent is extended or adjusted under 35 U.S.C. 154(b) by 0 days.

(21) Appl. No.: 15/741,305

(22) PCT Filed: Jun. 13, 2016

(86) PCT No.: PCT/IL2016/050617
§ 371 (c)(1),
(2) Date: Jan. 2, 2018

(87) PCT Pub. No.: WO2017/006307
PCT Pub. Date: Jan. 12, 2017

(65) Prior Publication Data
US 2018/0203285 A1    Jul. 19, 2018

Related U.S. Application Data

(60) Provisional application No. 62/189,227, filed on Jul. 7, 2015.

(51) Int. Cl.
*G02F 1/1333* (2006.01)
*G02F 1/1335* (2006.01)
(Continued)

(52) U.S. Cl.
CPC ....... *G02F 1/133362* (2013.01); *G02B 23/12* (2013.01); *G02F 1/135* (2013.01);
(Continued)

(58) Field of Classification Search
CPC ..... G02F 1/133362; G02F 2001/13355; G02F 1/1337; G02F 1/133509; G02F 1/1335; G02F 1/133528; G02B 23/12
See application file for complete search history.

(56) References Cited

U.S. PATENT DOCUMENTS

| 4,831,452 A | 5/1989 | Takanashi et al. |
| 6,573,953 B1 * | 6/2003 | Igasaki .................. G02F 1/135 349/113 |

(Continued)

OTHER PUBLICATIONS

Safrani, Avner, Spectropolarimetric systems for biomedical imaging and liquid crystal devices applications. / [Beer Sheva]: Ben Gurion University of the Negev, 2009. M.Sc Thesis (150 pages).
(Continued)

*Primary Examiner* — Jia Pan
(74) *Attorney, Agent, or Firm* — Roach Brown McCarthy & Gruber, P.C.; Kevin D. McCarthy

(57) ABSTRACT

The invention is an optical system for up-conversion of SWIR images into visible images. The optical system of the invention comprises a liquid crystal optically addressed spatial light modulator (LC-OASLM), which acts as an optical valve, and two optionally GRADIUM lenses to reduce the size and complexity of the optical setup. In embodiments of the invention, the photosensitive layer is replaced by a photodiode or array of photodiodes and the liquid crystal layer is replaced by an array (film) of organic light emitting diodes which emit light at the VIS by collecting SWIR light or by a fluorescence layer with sensitivity in the SWIR range.

8 Claims, 2 Drawing Sheets

(51) Int. Cl.
  G02F 1/1337 (2006.01)
  G02B 23/12 (2006.01)
  H04N 5/33 (2006.01)
  G02F 1/133 (2006.01)
  G02F 1/135 (2006.01)
  H01L 27/32 (2006.01)

(52) U.S. Cl.
  CPC ........ G02F 1/1335 (2013.01); G02F 1/13318 (2013.01); G02F 1/133502 (2013.01); G02F 1/133509 (2013.01); G02F 1/133528 (2013.01); H01L 27/3227 (2013.01); H04N 5/33 (2013.01); *G02F 1/1337* (2013.01); *G02F 2001/13355* (2013.01); *G02F 2001/133302* (2013.01)

(56) References Cited

U.S. PATENT DOCUMENTS

| | | | | |
|---|---|---|---|---|
| 6,894,846 | B1 | 5/2005 | He et al. | |
| 2004/0246556 | A1* | 12/2004 | Tsukagoshi | G03H 1/0465 359/238 |
| 2004/0258353 | A1* | 12/2004 | Gluckstad | G02B 6/02347 385/28 |
| 2007/0273770 | A1* | 11/2007 | Manassen | B82Y 20/00 348/222.1 |
| 2009/0015530 | A1* | 1/2009 | Goetz | G02F 1/133362 345/89 |
| 2014/0253849 | A1* | 9/2014 | Poon | G02B 27/102 349/97 |

OTHER PUBLICATIONS

Bortolozzo, Umberto, Stefania Residori, and Jean-Pierre Huignard. "Transmissive liquid crystal light-valve for near-infrared applications," Applied optics 52.22 (2013): E73-E77 (5 pages).

Kelly, S. M., and M. O'Neill, "Liquid crystals for electro-optic applications." Handbook of advanced electronic and photonic materials and devices 7 (2000) (66 pages).

Residori, Stefania, "Patterns, fronts and structures in a liquid-crystal-light-valve with optical feedback." Physics Reports 416.5 (2005): 201-272 (abstract only—2 pages).

Efron, Uzi, ed., Spatial light modulator technology: materials, devices, and applications. vol. 47. CRC Press, 1994—Pages available at https://books.google.co.il/books?hl=en&lr=&id=wNWf74BZAQYC&oi=fnd&pg=PR3&dq=efron+uzi+spatial+light+modulator&ots=LQM3wklAZD&sig=2Oh-qtzhc1EquLqpp4puVPCTAfU&redir_esc=y#v=onepage&q=efron%20uzi%20spatial%20light%20modulator&f=false on Aug. 31, 2018 (65 pages).

International Search Report from PCT/IL2016/050617, dated Sep. 26, 2016, 5 pages.

Written Opinion of the International Searching Authority from PCT/IL2016/050617, dated Sep. 26, 2016, 5 pages.

Kirzhner, Miri Gelbaor, et al. "Liquid crystal high-resolution optically addressed spatial light modulator using a nanodimensional chalcogenide photosensor." Optics letters 39.7 (2014): 2048-2051 (5 pages).

* cited by examiner

SWIR TO VISIBLE UP-CONVERSION OPTICAL SYSTEM

FIELD OF THE INVENTION

The invention is from the field of photon up-conversion devices. Specifically the invention is from the field of up-conversion devices for converting images detected in short wavelength infrared light into images in the visible wavelength range.

BACKGROUND OF THE INVENTION

There is great interest in photon up-conversion devices in many fields. In particular in the field of devices capable of allowing humans to see images of scenes that are in nearly total darkness. Particularly important in this respect are devices that are capable of converting short wavelength infrared (SWIR) images into visible ones.

The importance of the SWIR range of wavelengths is that the spectral irradiance of natural light sources such as nightglow known also as airglow is several times stronger in the SWIR range than in the near infrared (NIR) range. Also the transparency through fog and dust is much higher in the SWIR range than in the visible or NIR. Thus scenes and objects that cannot be seen in visible light even in daylight can be viewed using SWIR natural light. In addition in this wavelength range the device doesn't need cooling.

In general, present day advanced SWIR to visible up-conversion devices have several deficiencies including high cost, relatively large size and weight, and in some cases require cooling using liquid nitrogen. In addition, other proposed up-conversion devices suffer from low quantum efficiency due to low SWIR photon absorption and Low efficiency of the conversion process.

Liquid crystals spatial light modulators are well established technology [1]. By using spatial light modulators (SLM), the phase and/or amplitude of a beam of light can be modulated. There are two standard types of light modulation using liquid crystals (LC) devices. The first type is the so called electrically addressed SLM (EASLM) wherein an electrical signal drives the orientation of the LC molecules which in turn causes a phase and/or amplitude modulation of the beam transmitted/reflected trough the device. The second type is the so called optically addressed SLM (OASLM), wherein an optical signal with wavelength $\lambda_1$ drives the LC molecules orientation which in turn causes a phase and/or amplitude modulation of a second beam with wavelength $\lambda_2$. The driving signal is usually called the writing beam, whereas the transmitted/reflected beam is usually called the reading beam; this writing beam usually absorbed by a photo conductive layer and the liquid crystals act as a modulator [2] on the reading beam.

It is a purpose of the present invention to provide a small low-cost up-conversion device for converting SWIR images into visible images.

Further purposes and advantages of this invention will appear as the description proceeds.

SUMMARY OF THE INVENTION

Publications and other reference materials referred to herein are numerically referenced in the following text and respectively grouped in the appended Bibliography which immediately precedes the claims.

The invention is a short wavelength infrared (SWIR) to visible wavelength (VIS) up conversion optical system. The system comprises:
 a. a first GRADIUM lens 44, which projects SWIR images into the optical system;
 b. a LC-OASLM unit 10, which accepts a SWIR image from the first GRADIUM lens 44;
 c. a VIS light source 54;
 d. a second GRADIUM lens 50, which focus VIS light from the VIS source 54 onto the LC-OASLM unit 10 and projects VIS images from the LC-OASLM unit 10 towards infinity;
 e. a short pass filter 46 which reflects SWIR light onto the LC-OASLM unit 10 and transmit VIS light from the VIS source to LC-OASLM unit 10 and back from LC-OASLM unit 10 to the second GRADIUM lens 50; and
 f. a polarization beam splitter (PBS) 52;
wherein the LC-OASLM Unit 10 comprises:
 A. a first optical substrate 12 comprising:
  i. a SWIR high reflecting coating film 14;
  ii. a first glass substrate 16;
  iii. an ITO layer 18;
  iv. a SWIR photo sensitive layer 20; and
  v. a first LC alignment layer 22;
 B. a LC layer 24;
 C. a second optical substrate 26 comprising:
  i. a second LC alignment layer 28;
  ii. an ITO layer 30;
  iii. a second glass substrate 32; and
  iv. a SWIR anti reflection layer 34.

In embodiments of the optical system of the invention the short pass filter 46 can have a concave shape.

In embodiments of the optical system of the invention the short pass filter 46 can have a convex shape.

In embodiments of the optical system of the invention the photosensitive layer 20 is replaced with a photodiode or array of photodiodes so that the first optical substrate 12 is comprised of:
 i. a SWIR high reflecting coating film;
 ii. an ITO layer
 iii. a photodiode or array of photodiodes; and
 iv. a first LC alignment layer.

In embodiments of the optical system of the invention the LC layer 24 is replaced with an array (film) of organic light emitting diodes (OLED) which emit light at the VIS by collecting SWIR light. In these embodiments the reading unit comprising green LED 54 and polarized beam splitter 52 and the alignment layers 22, 28 on the optical substrates 12, 26 are removed from the system.

In embodiments of the optical system of the invention the LC layer 24 is replaced with a fluorescence layer with sensitivity in the SWIR range. In these embodiments the reading unit comprising green LED 54 and polarized beam splitter 52 and the alignment layers 22, 28 on the optical substrates 12, 26 are removed from the system.

All the above and other characteristics and advantages of the invention will be further understood through the following illustrative and non-limitative description of embodiments thereof, with reference to the appended drawings.

DETAILED DESCRIPTION OF EMBODIMENTS OF THE INVENTION

The invention is an optical system for up-conversion of SWIR images into visible images. The optical system of the invention comprises a liquid crystal optically addressed spatial light modulator (LC-OASLM), which acts as an optical valve, and two optionally GRADIUM lenses to reduce the size and complexity of the optical setup. In embodiments of the invention, the liquid crystal layer is replaced by an array (film) of organic light emitting diodes which emit light at the VIS by collecting SWIR light or by a fluorescence layer with sensitivity in the SWIR range.

Figure 1:
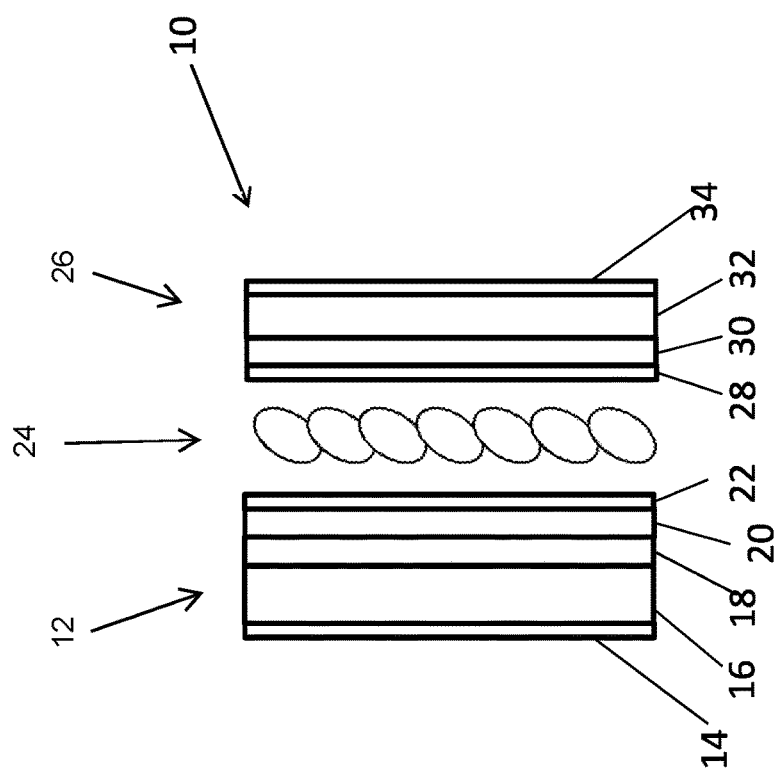
FIG. 1 schematically shows a liquid crystal optically addressed spatial light modulator, and FIG. 2 schematically shows the SWIR to visible up-conversion system of the invention.

In FIG. 1 a liquid crystal optically addressed spatial light modulator (LC-OASLM) is depicted. This LC-OASLM 10 acts as an optical valve, which is comprised of: a first optical substrate 12, a second optical substrate 26, and a liquid crystal (LC) layer 24. The first optical substrate is comprised of a first optical glass substrate 16 which is coated with a SWIR high reflection (HR) coating film 14 deposited on its left facet and with an indium tin oxide (ITO) layer 18 and a thin film photo sensing material 20 (photosensor) deposited on its right facet. This composite glass is used as one of the substrates for the construction of the LC-OASLM; The LC material is stacked between a first alignment layer 22 on the first optical substrate 12 and a second alignment layer 28 on the second optical substrate 26. A comprehensive review of the preparation and construction procedures of LC devices can be found in [3]. The second optical substrate 26 is comprised of a second glass substrate 32 coated on its left facet with an ITO film 30, which is used as a transparent electrode that, together with the photo sensing film 20, provides an electrical field distribution, across the LC cell 10. On the right facet of the ITO coated glass an anti-reflection coating layer 34 is deposited in order to improve the transitivity of the SWIR light from the LC-OASLM.

When a SWIR beam is projected onto the photosensitive layer 20, a local electron-hole charge separation is produced which influences the local voltage level across the LC cell 10. As a result, the LC molecules in this region change their orientation which causes a local modulation of the birefringence dispersion or the effective refractive index; this process is usually termed "writing" [4]. When a visible beam is incident on OASLM 10, the reflected beam is modulated only at the region where the local voltage change occurred; this process is usually termed "reading" [5, 6].

Figure 2:
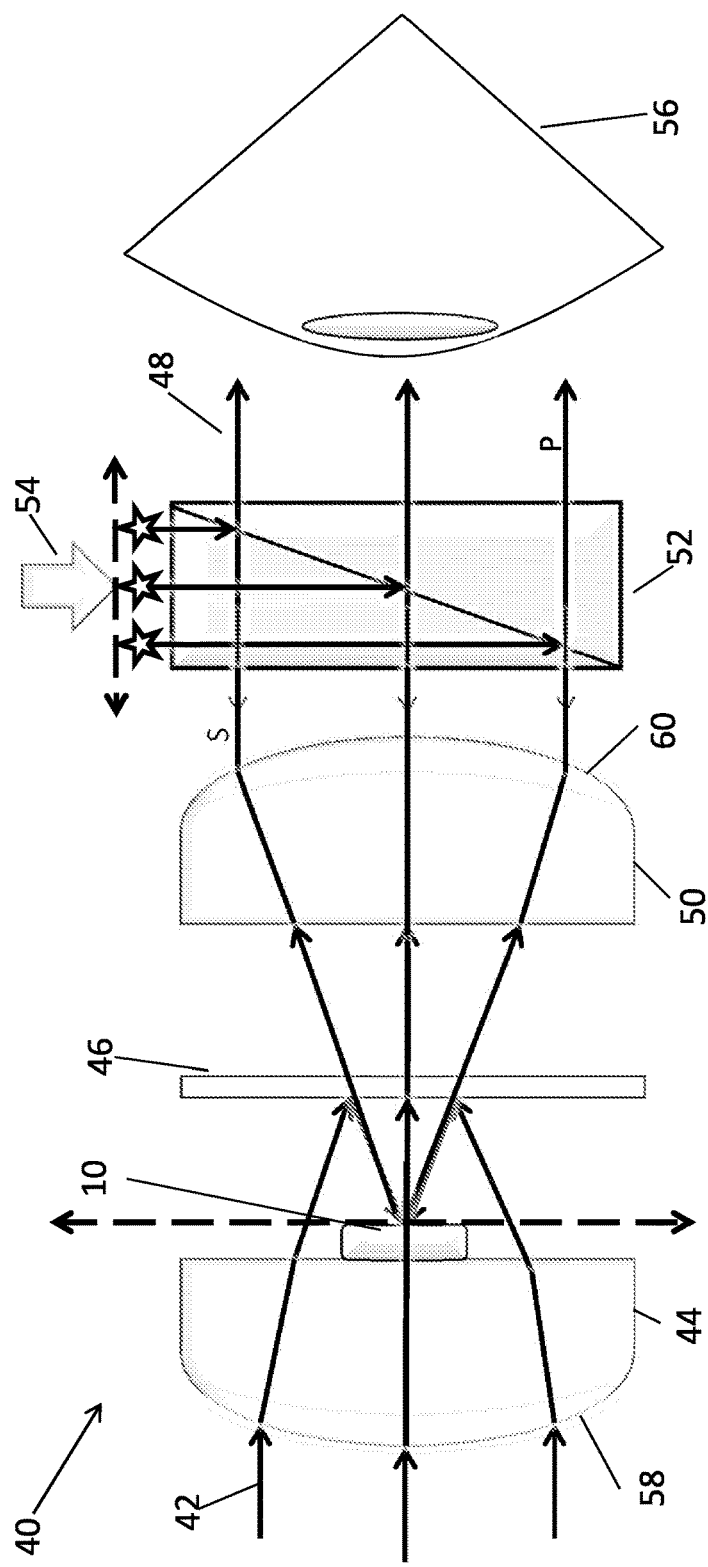

FIG. 2 schematically shows the SWIR to visible up-conversion system 40 of the invention. The optical setup is comprised of a first GRADIUM lens 44 that functions in a similar manner to a Mirau objective lens. The LC-OASLM detailed in FIG. 1 is centered at the middle of the objective lens 44 and also serves as an annular aperture for the first GRADIUM lens 44. To the right of the first GRADIUM lens 44 there is a short-pass filter 46 that reflects SWIR wavelengths 42 and transmits visible light 48. Short-pass filter 46 is located at a position from which it will reflect the writing beam to the LC-OASLM 10 at the focal plane of the first GRADIUM lens 44 and transmit a reading beam to the back focal plane of a second GRADIUM lens 50. The short pass filter 46 can be flat as drawn in FIG. 2 or it can be curved (concave or convex) so that an erect image is obtained on the photosensor with the minimum number of components. The second GRADIUM lens b and a polarized beam splitter (PBS) 52 are placed after short-pass filter b. On top of PBS 52 there is a green LED 54 that functions as a reading beam. The first GRADIUM lens 44 has a SWIR antireflection coating 58 deposited on all its surfaces to maximize transmission of SWIR light. The second GRADIUM lens 50 has a visible antireflection coating 60 deposited on all its surfaces to maximize transmission of visible light. The overall optical conversion system shown in FIG. 2 projects a visible image onto a human eye 56 that is identical to the SWIR image gathered by the first GRADIUM lens 44.

The incoming SWIR light 42 from the left is diffracted by the first GRADIUM lens 44 onto the short-pass filter 46, which reflects the SWIR light to the LC-OASLM layer 10 generating a writing process. Simultaneously, the visible reading light is projected from the green LED 54 onto the PBS 52 which separates the S and P polarization components by reflecting the S component at the dielectric beam splitter coating to the second GRADIUM lens, while allowing the P component to pass. The polarized reading light beam is focused on the LC-OASLM 10, which acts as an optical LC valve working in reflection. The visible light reads the SWIR image and changes polarization due to birefringence modulation caused by the liquid crystals. The visible P polarized light is reflected from LC-OASLM 10 back to the PBS 52 through the second GRADIUM lens 50 and continues to the human eye 56. With the optical arrangement shown in FIG. 2 the visible image seen by the observer is up-side-down relative to the SWIR image, but there are several different options that are well known in the art for inverting the final image.

In another embodiment of the invention the LC layer is replaced with an array (film) of organic light emitting diodes (OLED) which emit visible light upon receiving photocurrent from the photosensor generated by the SWIR light. In this case the reading unit comprising green LED 54 and polarized beam splitter 52 can be removed. Also when an OLED array is used there is no need for the alignment layers 22, 28 on the optical substrates 12, 26.

In another embodiment of the invention the LC layer is replaced with a fluorescence layer with sensitivity in the SWIR range. In this case the reading unit comprising green LED 54 and polarized beam splitter 52 and the alignment layers 22, 28 on the optical substrates 12, 26 can be removed from the system.

In another embodiment of the invention the photosensor maybe made of a photodiode structure or an array of photodiodes sensitive to the SWIR light.

Although embodiments of the invention have been described by way of illustration, it will be understood that the invention may be carried out with many variations, modifications, and adaptations, without exceeding the scope of the claims.

BIBLIOGRAPHY

[1] Efron, Uzi, ed., Spatial light modulator technology: materials, devices, and applications. Vol. 47. CRC Press, 1994.

[2] Kirzhner, Miri Gelbaor, et al. "Liquid crystal high-resolution optically addressed spatial light modulator using a nanodimensional chalcogenide photosensor." Optics letters 39.7 (2014): 2048-2051.

[3] Safrani, Avner, Spectropolarimetric systems for biomedical imaging and liquid crystal devices applications./ [Beer Sheva]: Ben Gurion University of the Negev, 2009. M.Sc Thesis.

[4] Bortolozzo, Umberto, Stefania Residori, and Jean-Pierre Huignard. "Transmissive liquid crystal light-valve for near-infrared applications," Applied optics 52.22 (2013): E73-E77.

[5] Kelly, S. M., and M. O'Neill, "Liquid crystals for electro-optic applications." Handbook of advanced electronic and photonic materials and devices 7 (2000).

[6] Residori, Stefania, "Patterns, fronts and structures in a liquid-crystal-light-valve with optical feedback." Physics Reports 416.5 (2005): 201-272.

The invention claimed is:

1. A short wavelength infrared (SWIR) to visible wavelength (VIS) up conversion optical system comprising:
   a. a first GRADIUM lens, which projects SWIR images into the optical system;
   b. a liquid crystal optically addressed spatial light modulator (LC-OASLM) unit, which accepts a SWIR image from the first GRADIUM lens;
   c. a VIS light source;
   d. a second GRADIUM lens, which focus VIS light from the VIS source onto the LC-OASLM unit and projects VIS images from the LC-OASLM unit towards infinity;
   e. a short pass filter which reflects SWIR light onto the LC-OASLM unit and transmit VIS light from the VIS source to LC-OASLM unit and back from LC-OASLM unit to the second GRADIUM lens; and
   f. a polarization beam splitter (PBS);
   wherein the LC-OASLM Unit comprises:
      A. a first optical substrate comprising:
         i. a SWIR high reflecting coating film;
         ii. a first glass substrate;
         iii. an indium tin oxide (ITO) layer;
         iv. a SWIR photo sensitive layer; and
         v. a first liquid crystal (LC) alignment layer;
      B. a LC layer;
      C. a second optical substrate comprising:
         i. a second LC alignment layer;
         ii. an ITO layer;
         iii. a second glass substrate; and
         iv. a SWIR anti reflection layer.

2. The optical system of claim 1 where the short pass filter has a concave shape.

3. The optical system of claim 1 where the short pass filter has a convex shape.

4. The optical system of claim 1 where the photosensitive layer is replaced with a photodiode or array of photodiodes so that the first optical substrate is comprised of:
   i. a SWIR high reflecting coating film;
   ii. an ITO layer
   iii. a photodiode or array of photodiodes; and
   iv. a first LC alignment layer.

5. The optical system of claim 1 where the LC layer is replaced with an array (film) of organic light emitting diodes (OLED) which emit light at the VIS by collecting SWIR light.

6. The optical system of claim 5 wherein the reading unit comprising green LED and polarized beam splitter and the alignment layers on the optical substrates are removed from the system.

7. The optical system of claim 1 where the LC layer is replaced with a fluorescence layer with sensitivity in the SWIR range.

8. The optical system of claim 7 wherein the reading unit comprising green LED and polarized beam splitter and the alignment layers on the optical substrates are removed from the system.

* * * * *